US009640538B2

(12) United States Patent
Liu et al.

(10) Patent No.: US 9,640,538 B2
(45) Date of Patent: May 2, 2017

(54) EMBEDDED DRAM IN REPLACEMENT METAL GATE TECHNOLOGY

(71) Applicant: GLOBALFOUNDRIES Inc., Grand Cayman (KY)

(72) Inventors: Yanxiang Liu, Glenville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/527,278

(22) Filed: Oct. 29, 2014

(65) Prior Publication Data
US 2016/0126245 A1    May 5, 2016

(51) Int. Cl.
*H01L 21/3065*    (2006.01)
*H01L 27/108*    (2006.01)
*H01L 21/308*    (2006.01)

(52) U.S. Cl.
CPC ........ *H01L 27/1087* (2013.01); *H01L 21/308* (2013.01); *H01L 21/3065* (2013.01); *H01L 27/10826* (2013.01); *H01L 27/10832* (2013.01); *H01L 27/10867* (2013.01); *H01L 27/10879* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,671,175 A | * | 9/1997 | Liu | H01L 27/10808 257/296 |
| 7,009,236 B2 | * | 3/2006 | Chen | H01L 27/10867 257/296 |
| 2006/0094217 A1 | * | 5/2006 | Dittmar | H01L 21/76804 438/597 |
| 2011/0193179 A1 | * | 8/2011 | Fung | H01L 21/2652 257/408 |
| 2012/0012937 A1 | * | 1/2012 | Chew | H01L 21/28088 257/369 |
| 2013/0146959 A1 | * | 6/2013 | Cheng | H01L 29/66181 257/310 |

(Continued)

OTHER PUBLICATIONS

G. Wang et al., "0.127 μm2 High Performance 65nm SOI Based embedded DRAM for on-Processor Applications", International Electron Devices Meeting, 2006, 4 pages.

(Continued)

*Primary Examiner* — Marc Armand
*Assistant Examiner* — Shannon Yi
(74) *Attorney, Agent, or Firm* — Ditthavong & Steiner, P.C.

(57) ABSTRACT

Methods for forming an eDRAM with replacement metal gate technology and the resulting device are disclosed. Embodiments include forming first and second dummy electrodes on a substrate, each dummy electrode having spacers at opposite sides and being surrounded by an ILD; removing the first and second dummy electrodes, forming first and second cavities, respectively; forming a hardmask over the substrate, exposing the first cavity; forming a deep trench in the substrate through the first cavity; removing the hardmask; and forming a capacitor in the first cavity and deep trench and concurrently forming an access transistor in the second cavity.

18 Claims, 13 Drawing Sheets

(56) References Cited

U.S. PATENT DOCUMENTS

| | | | | |
|---|---|---|---|---|
| 2013/0256805 A1* | 10/2013 | Chuang | ........... | H01L 21/823842 257/369 |
| 2015/0303191 A1* | 10/2015 | Feng | ................ | H01L 29/66181 257/301 |
| 2015/0349121 A1* | 12/2015 | Dasaka | ................... | H01L 21/84 257/303 |

OTHER PUBLICATIONS

N. Butt et al., "A 0.039um2 High Performance eDRAM Cell based on 32nm High-K/Metal SOI Technology", 2010 IEEE International Electron Devices Meeting, 4 pages.

R. Brain et al., "A 22nm High Performance Embedded DRAM SoC Technology Featuring Tri-gate Transistors and MIMCAP COB", 2013 Symposium on VLSI Technology Digest of Technical Papers, pp. T16-T17.

* cited by examiner

EMBEDDED DRAM IN REPLACEMENT METAL GATE TECHNOLOGY

TECHNICAL FIELD

The present disclosure relates to fabrication of embedded dynamic random access memory (eDRAM). In particular, the present disclosure relates to gate last methods for preparing eDRAM cells with deep trench capacitors and Fin capacitors.

BACKGROUND

In an integrated circuit, each bit of dynamic data is stored in a tiny circuit called a memory cell including an access transistor and an associated capacitor. Information or data is stored in the cell in the form of a charge on the capacitor. In the cell, the gate on the transistor is connected to a "wordline," and the source of the transistor is connected to a "bitline." The drain of the transistor is connected to the associated cell capacitor (with the other node of the capacitor connected to the ground or Vcc or Vcc/2). When both the wordline and the bitline are brought to high voltage and the gate-to-source voltage (Vgs) is high enough, the transistor is on and charge can flow to the capacitor. If the capacitor initially has no charge (stored 0) then charge flows into the capacitor, but if the capacitor initially is charged (stored 1) then very little charge flows into the capacitor. To read an individual bit, the sensing circuitry measures the charge stored on the capacitor and determines whether it is 0 or 1. Since capacitors leak charge over time, the information or data eventually fades unless the capacitor charge is refreshed periodically. Examples of memory cells that require periodic refreshing include dynamic random access memory (DRAM) and eDRAM cells.

eDRAM cells with deep trench capacitors or stack capacitors have become a standard feature in most electronic devices requiring cache memory, largely due to increased bit count, lower standby power, and increased stability over static random access memory (SRAM), as well as compatibility with CMOS and FinFET technologies. A major challenge with implementing eDRAM technology is the compatibility of process to logic flow with low enough cost and reasonable complexity of fabricating the trenches in the substrate deep enough or the stacked capacitor high enough to achieve the required capacitance. One way to alleviate the need for deep trenches (or high capacitor stacks) is to increase the unit area capacitance through use of a high-k node dielectric material such as hafnium oxide ($HfO_2$). However, with the increasing demand for greater eDRAM technology, there remains a need for processes that reduce the cost of production of eDRAM cells while increasing the area density and memory performance of the cell. Comparing to high density DRAM array, the embedded DRAM (in logic circuit) can utilize shorter word-line and bitline; so that the cell capacitance (<5 nF) and cell leakage can be relaxed than DRAM (in order to use same process steps logic process, e.g. high-k gate thickness) to achieve lower cost.

A need therefore exists for methodology enabling the low cost production of eDRAM cells with increased area density and performance.

SUMMARY

An aspect of the present disclosure includes a method for preparing an eDRAM cell, by removing two dummy electrodes, forming two cavities, forming a deep trench through one of the cavities, and forming a capacitor in the deep trench while concurrently forming a transistor in the other cavity.

Another aspect of the present disclosure includes a method for preparing an eDRAM cell using FinFETS, by removing two dummy electrodes over fins, forming two cavities, forming a deep trench through one of the cavities in an STI region, and forming a capacitor in the deep trench while concurrently forming a transistor in the other cavity.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming first and second dummy electrodes on a substrate, each dummy electrode having spacers at opposite sides and being surrounded by an inter-layer dielectric (ILD); removing the first and second dummy electrodes, forming first and second cavities, respectively; forming a hardmask over the substrate, exposing the first cavity; forming a deep trench in the substrate through the first cavity; removing the hardmask; and forming a capacitor in the first cavity and deep trench and concurrently forming an access transistor in the second cavity.

Other aspects of the present disclosure include forming the capacitor and the access transistor by forming a high-k dielectric layer and a first metal layer, sequentially, in the first cavity and deep trench and in the second cavity; and filling the first cavity and deep trench and the second cavity with a second metal. Still other aspects include forming the high-k dielectric layer and the first metal layer by atomic layer deposition (ALD). Further aspects include forming the first metal layer of titanium nitride (TiN)/tantalum nitride (TaN). Still further aspects include forming source/drain regions in the substrate at opposite sides of the second dummy electrode prior to removing the dummy electrodes. Other aspects of the disclosure include connecting the second metal in the second cavity to a wordline, the source region to a bitline, and the second metal in the first cavity to the drain region. Still other aspects include forming the hardmask by applying a spin-on hardmask. Further aspects include removing the hardmask by etching. Still further aspects include forming the deep trench by reactive ion etching.

According to the present disclosure, some technical effects may be achieved in part by a method including forming first and second dummy electrodes over a silicon fin and an adjacent shallow trench isolation (STI) region formed on a substrate, each dummy electrode having spacers at opposite sides and being surrounded by an ILD; removing the first and second dummy electrodes, forming first and second cavities, respectively; forming a hardmask over the substrate, exposing a portion of the first cavity over the STI region; forming a deep trench in the STI region through the portion of the first cavity; removing the hardmask; and forming a capacitor in the first cavity and deep trench and concurrently forming an access transistor in the second cavity.

Other aspects of the present disclosure include forming the capacitor and the access transistor by forming a high-k dielectric layer and a first metal layer, sequentially, in the first cavity and deep trench and in the second cavity; and filling the first cavity and deep trench and the second cavity with a second metal. Still other aspects include forming the high-k dielectric layer and the first metal layer by ALD. Further aspects include forming the first metal layer of TiN/TaN. Still further aspects include epitaxially growing source/drain regions on the silicon fin at opposite sides of the second dummy electrode prior to removing the dummy electrodes. Other aspects of the disclosure include connecting the second metal in the second cavity to a wordline, the source region to a bitline, and the second metal in the first cavity to the drain region. Still other aspects include forming the hardmask by applying a spin-on hardmask. Further aspects include removing the hardmask by etching. Still further aspects include forming the deep trench by reactive ion etching.

According to the present disclosure, some technical effects may be achieved in part by a method including forming first and second dummy electrodes over a substrate, forming source/drain regions at opposite sides of the second dummy electrode; forming spacers at opposite sides of each of the first and second dummy electrodes and forming an ILD over the substrate; chemical-mechanical polishing/planarization (CMP) the ILD down to a top surface of the first and second dummy electrodes; removing the first and second dummy electrodes, forming first and second cavities, respectively; spinning on a hardmask over the substrate, exposing the first cavity; etching a deep trench through the first cavity; removing the hardmask; and forming a capacitor in the first cavity and deep trench and concurrently forming an access transistor in the second cavity by depositing a high-k dielectric layer and a TiN/TaN layer, sequentially by ALD, in the first cavity and deep trench and in the second cavity; and filling the first cavity and deep trench and the second cavity with a metal.

Other aspects of the present disclosure include forming silicon fins separated by STI regions on the substrate; forming the dummy electrodes over the silicon fins and STI regions; and forming the deep trench in an STI region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
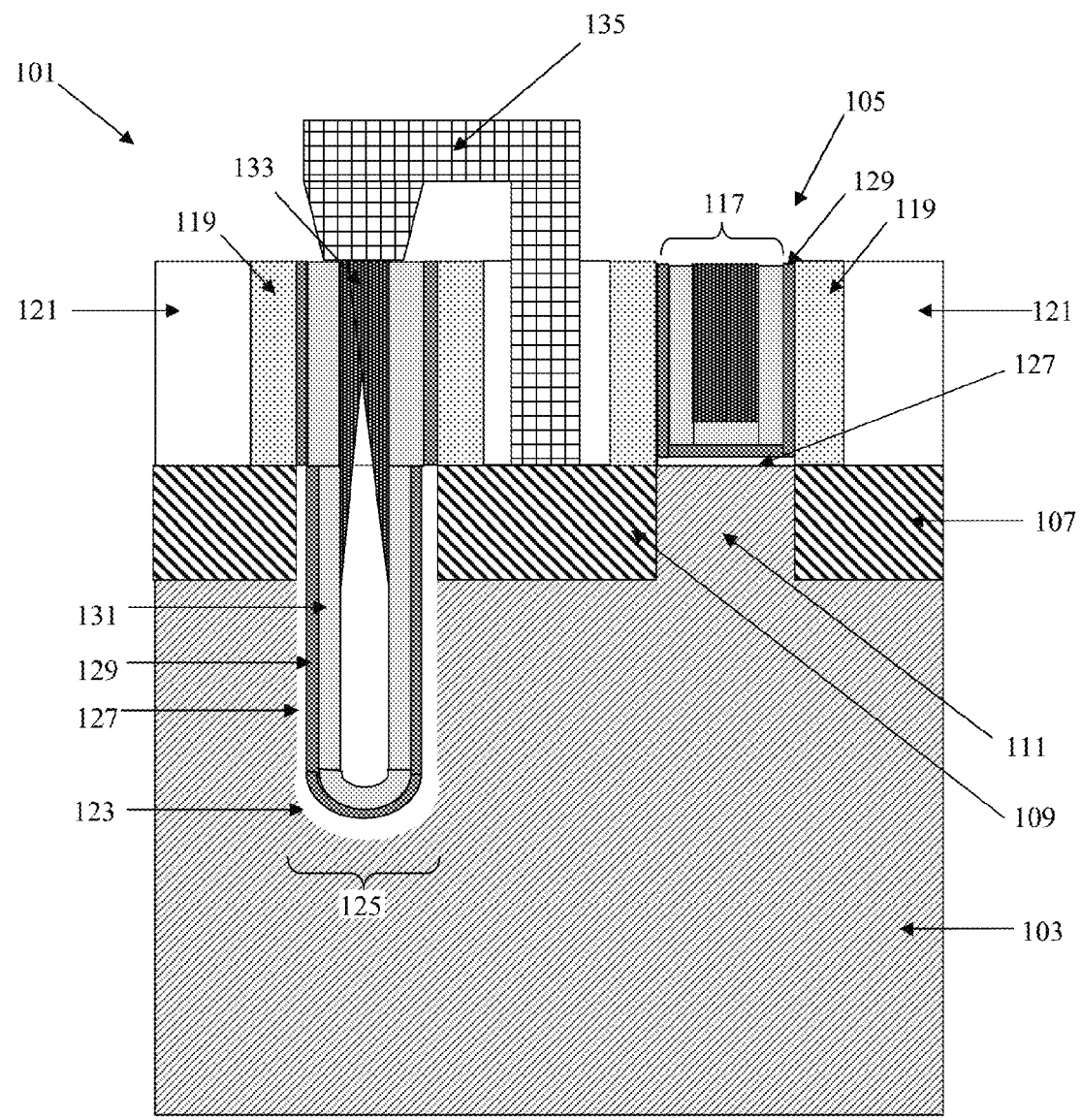
FIG. 1 illustrates a cross-sectional view of an eDRAM cell according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of high cost and complexity attendant upon fabricating an eDRAM cell while increasing the area density and memory performance of the cell. Methodology in accordance with embodiments of the present disclosure includes forming first and second dummy electrodes on a substrate, each dummy electrode having spacers at opposite sides and being surrounded by an ILD; and removing the first and second dummy electrodes to form first and second cavities, respectively. A hardmask is formed over the substrate, exposing the first cavity, and a deep trench is formed in the substrate through the first cavity to increase the cell capacitance. The hardmask is removed, and high-k and gate electrode formed as a capacitor in the first cavity and deep trench as well as the gate structure of an access transistor concurrently formed in the second cavity.

Methodology in accordance with embodiments of the present disclosure also includes forming first and second dummy electrodes over a silicon fin and an adjacent STI region formed on a substrate, each dummy electrode having spacers at opposite sides and being surrounded by an ILD; removing the first and second dummy electrodes, forming first and second cavities, respectively; forming a hardmask over the substrate, exposing a portion of the first cavity over the STI region; forming a deep trench in the STI region through the portion of the first cavity to increase the cell capacitance; removing the hardmask; and forming a capacitor in the first cavity and deep trench and concurrently forming an access transistor in the second cavity.

Methodology in accordance with embodiments of the present disclosure further includes forming first and second dummy electrodes over a substrate, forming source/drain regions at opposite sides of the second dummy electrode; forming spacers at opposite sides of each of the first and second dummy electrodes and forming an ILD over the substrate; CMP the ILD down to (expose) a top surface of the first and second dummy electrodes; removing the first and second dummy electrodes, forming first and second cavities, respectively; spinning on a hardmask over the substrate, exposing the first cavity; etching a deep trench through the first cavity; removing the hardmask; and forming a capacitor in the first cavity and deep trench and concurrently forming an access transistor in the second cavity by depositing a high-k dielectric layer and a TiN/TaN layer stack, sequentially by ALD, in the first cavity and deep trench and in the second cavity; and filling the first cavity and deep trench and the second cavity with a metal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1 illustrates a cross-sectional view of the components of an eDRAM cell 101 according to an exemplary embodiment. The cell includes a substrate layer 103, which may be formed of one or more n-type or p-type doped semiconductor materials. Alternatively, the substrate may be formed as a silicon-on-insulator (SOI) substrate (not shown for illustrative convenience), which includes a buried oxide (BOX) insulating layer, typically silicon dioxide ($SiO_2$), between a silicon wafer and an active silicon layer.

In FIG. 1, the access transistor 105 is shown as a planar FET, for example, a MOSFET or a CMOS FET. The transistor 105 includes a source 107 and a drain 109 (which are formed in the active silicon layer of an SOI substrate), and a channel 111 located between the source and drain. An oxide layer 127, a high-k dielectric layer 129, and a gate electrode 117 are formed over the channel 111. On the sides of the gate electrode 117 and high-k dielectric layer 129 and over the source 107 and drain 109 are spacers 119, which are surrounded by an ILD 121, such as $SiO_2$. A deep trench 123 is formed in substrate layer 103 (by Si etching) through ILD 121 for a capacitor 125. The capacitor 125 includes an oxide layer 127, a high-k dielectric layer 129, a first conductor 131 and a second conductor 133. A strap (or interconnect) 135 connects the source 107 to the second conductor 133 to allow electrical current to be stored on the capacitor 125. Spacers 119 are also formed around the portion of the high-k dielectric layer 129 that is formed above the substrate.

Figure 2A:
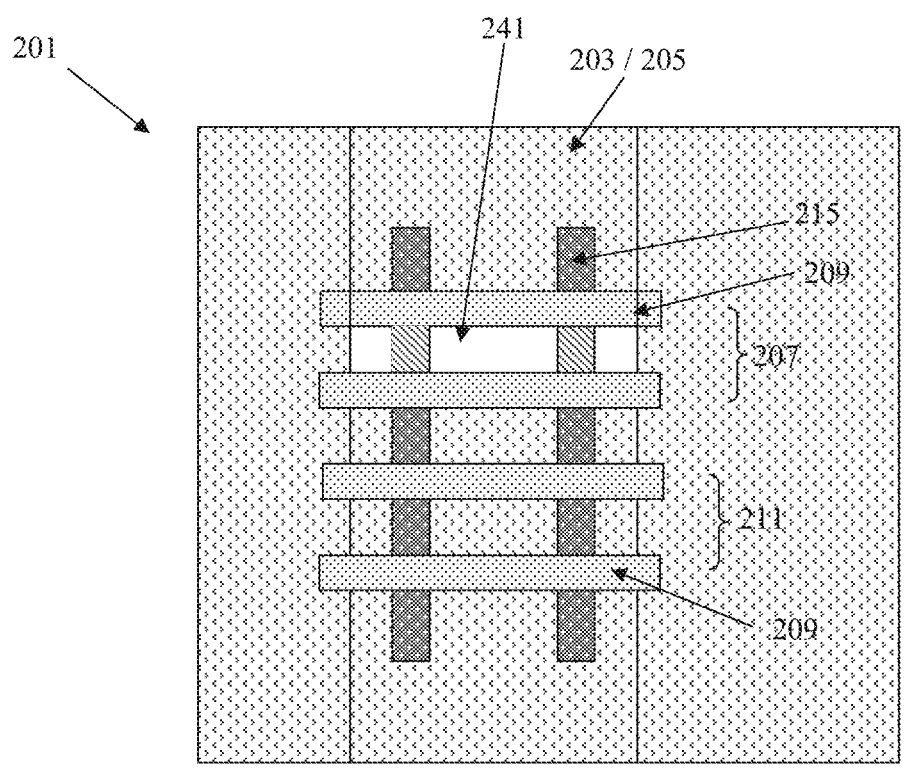
FIG. 2A illustrates a top view and FIGS. 2B through 2D illustrate cross-sectional views of an eDRAM cell according to another exemplary embodiment.
Figure 2B:
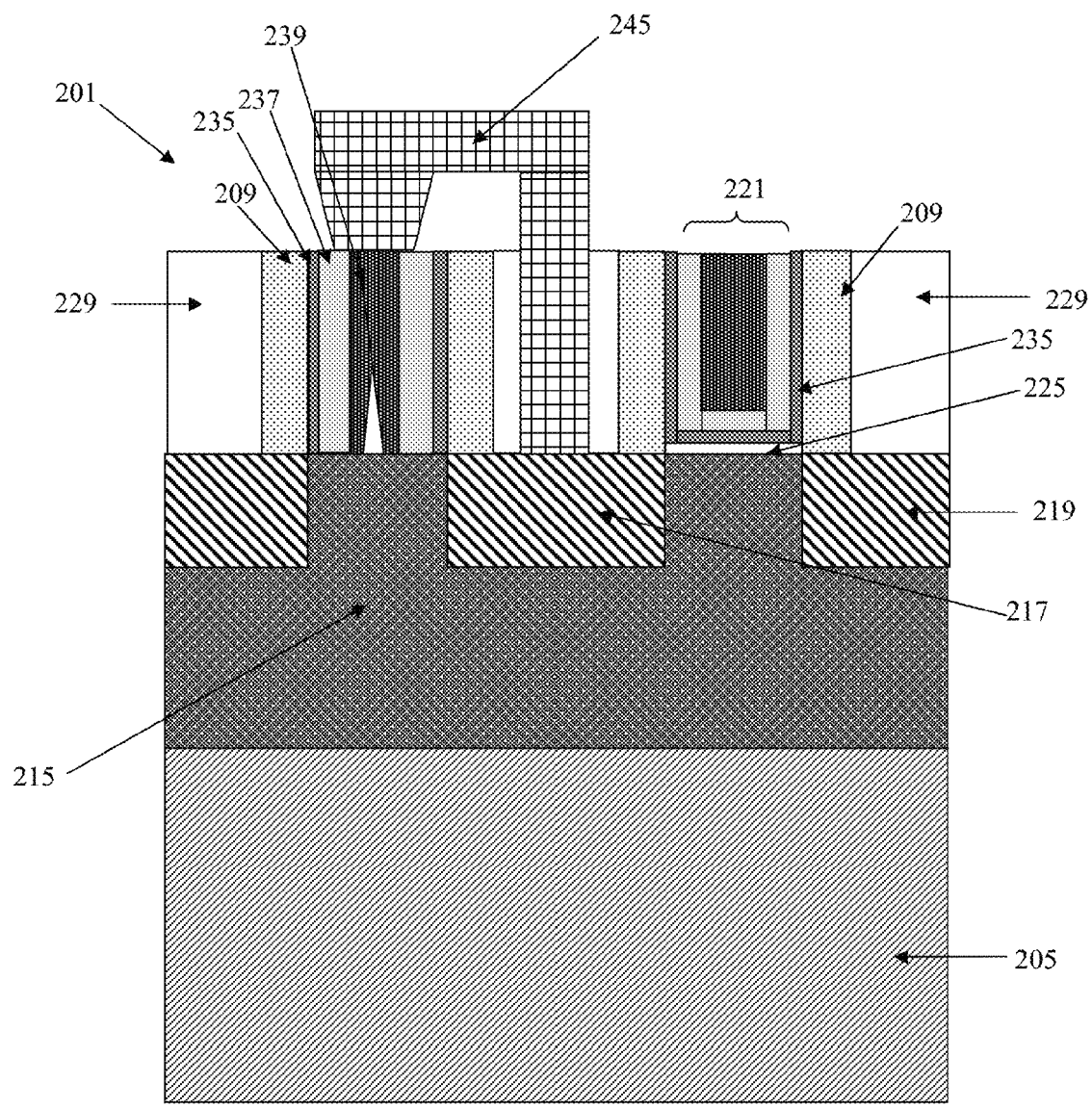
Figure 2C:
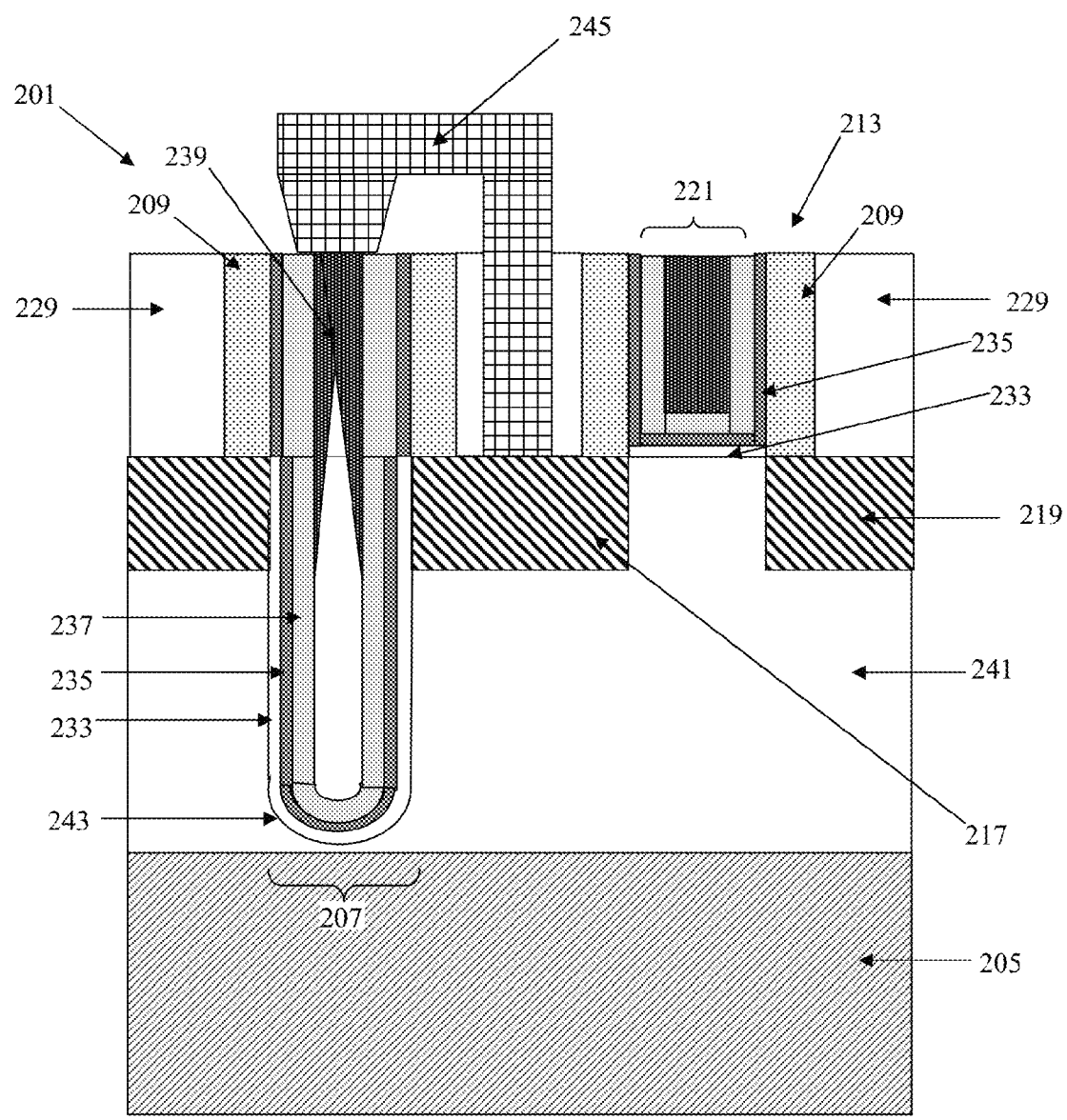
Figure 2D:
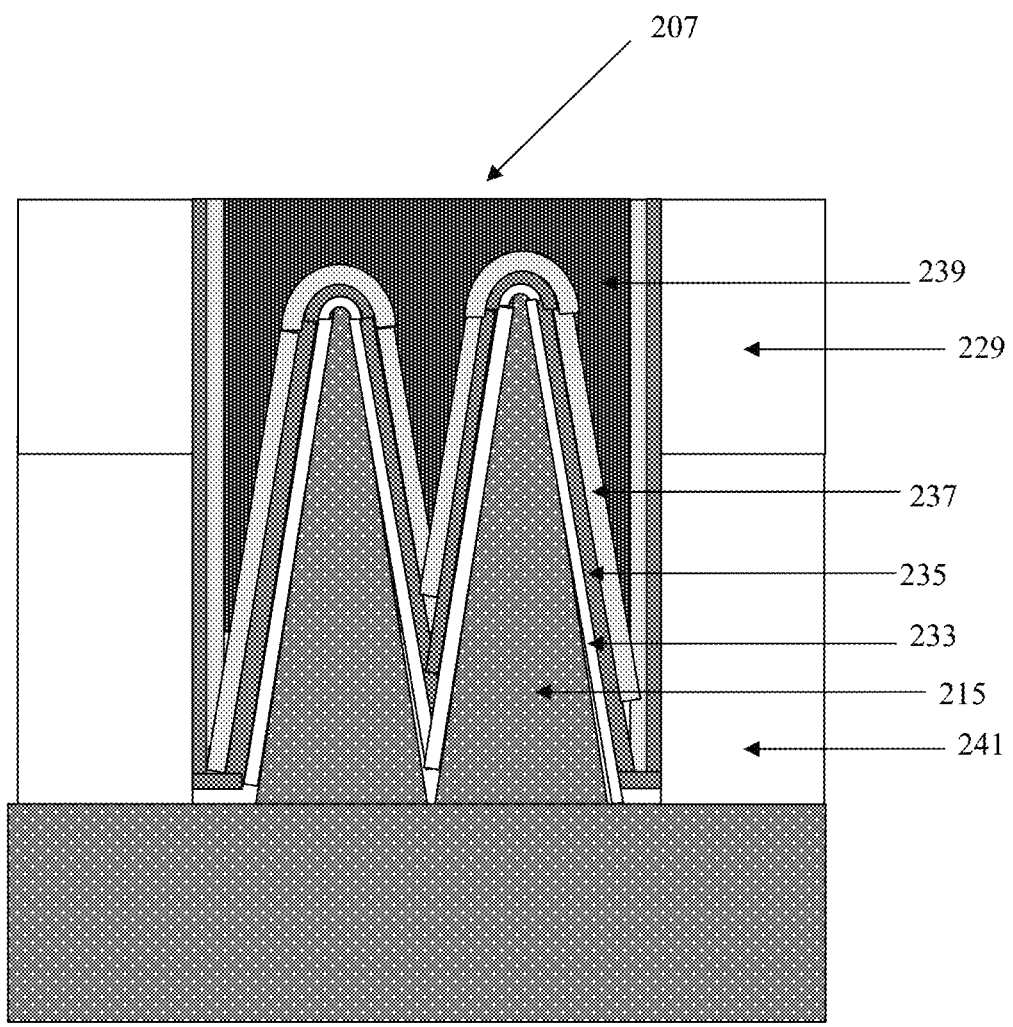

FIG. 2A illustrates a top view and FIGS. 2B through 2D illustrate cross-sectional views of the components of an eDRAM cell 201 according to another exemplary embodiment. In FIGS. 2A through 2D, the access transistor is shown as a non-planar FinFET. FIG. 2A shows a hardmask 203 over the entire substrate 205 with a gate opening for a capacitor 207 surrounded by spacers 209, and a gate opening for the access transistor 211 also surrounded by spacers 209, as employed in the process described with respect to FIGS. 3A through 3H.

In FIGS. 2A through 2D, the access transistor 211 includes a fin 215 (e.g. fin width is 10-25 nm and fin pitch is 45-60 nm at 14 nm FinFET node), with a source 217 and a drain 219. An oxide layer 225 is under the gate electrode 221, and a high-k dielectric layer 2 is also under and on the sides of gate electrode 221. Spacers 209 are on the sidewalls of gate electrode 221, with an ILD 229, such as $SiO_2$, surrounding the spacers. As shown in FIG. 2B, the capacitor 207 includes a high-k dielectric layer 235, a first conductor 237 and second conductor 239 disposed between spacers 209, which are surrounded by the ILD 229. Further, as illustrated in FIG. 2A, between fins 215 is an STI region 241, which is filled with an insulating material, such as $SiO_2$. As illustrated in FIG. 2C, a portion of the capacitor 207 is formed through ILD 229 and into a deep trench 243 formed in the STI region 241 (by etching oxide to the full depth of fin bottom). The portion in trench 243 includes oxide layer 233, high-k dielectric 235, first conductor 237, and second conductor 239. A strap (interconnect) 245 connects the source 217 to the second conductor 239 to allow electrical current to be stored on the capacitor 207.

FIG. 2D illustrates a cross-sectional view of the capacitor 207. As illustrated, ILD 229 is formed on STI region 241, surrounding fin 215. Oxide layer 233, high-k dielectric layer 235, the first conductor 237, and the second conductor 239 are sequentially formed on fin 215 to form capacitor 231.

FIGS. 3A through 3H illustrate a process for preparing an eDRAM cell having a planar FET or a FinFET according to exemplary embodiments.

Figure 3A:
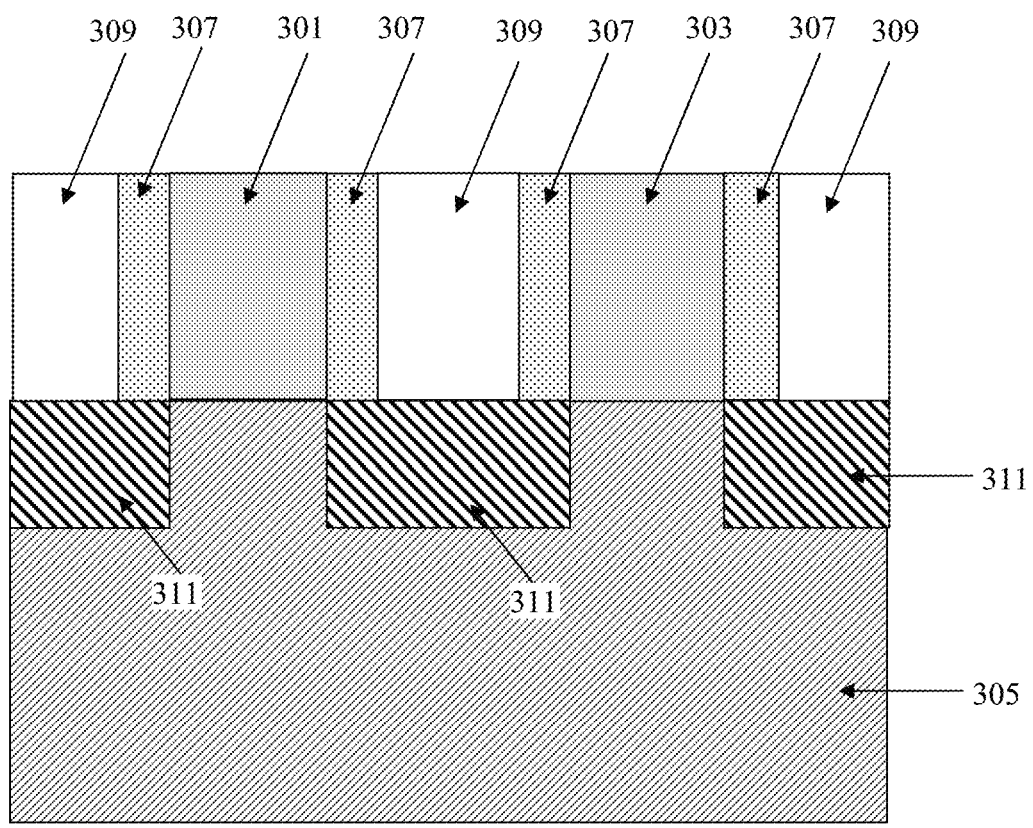
FIGS. 3A through 3H illustrate a process flow for preparing an eDRAM cell according to an exemplary embodiment.

In FIG. 3A, conventional front end of line (FEOL) processes provide dummy gates 301 and 303 over a substrate 305. Spacers 307 are provided on opposite sides of each of dummy gates 301 and 303, and an ILD 309 fills all of the space between and adjacent to spacers 307. Source/drain regions 311 are formed in substrate 305 at opposite sides of the dummy electrodes 301 and 303 prior to forming the spacers 307, for example by implanting a dopant in the substrate 305.

The substrate 305 may be based on SOI-technology (not shown for illustrative convenience) and include a BOX insulating layer between an active silicon layer and a substrate layer. SOI substrates provide improved performance and diminished short channel effects. The thickness of the substrate or the SOI layers varies with the intended application.

Exemplary materials for the dummy gates include but are not limited to polysilicon and amorphous silicon. The dummy gates may be formed by deposition of the dummy gate material, for example by chemical vapor deposition (CVD) or physical vapor deposition (PVD), followed by photolithography and etching processes (e.g., wet etching and/or dry etching). The spacers 307 may be formed on the sides of the dummy gates by depositing an insulating material on the dummy gates, followed by an anisotropic etching to shape the spacers. Spacers may be formed of hardmask materials, for example $SiO_2$, silicon nitride ($Si_3N_3$), silicon oxynitride ($Si_2N_2O$) and/or other dielectric materials.

The ILD 309 is formed of an insulating material. Examples of ILD materials include but are not limited to $SiO_2$ and $Si_2N_2O$. The ILD 309 may be deposited, for example, by CVD, high density plasma CVD (HDP-CVD), spin-on deposition, PVD or sputtering. After depositing the ILD over the substrate 305 and dummy gates 301 and 303, a CMP process may be performed down to an upper surface of the dummy gates 301 and 303 to provide a substantially planar surface and to expose the dummy gates 301 and 303.

Figure 3B:
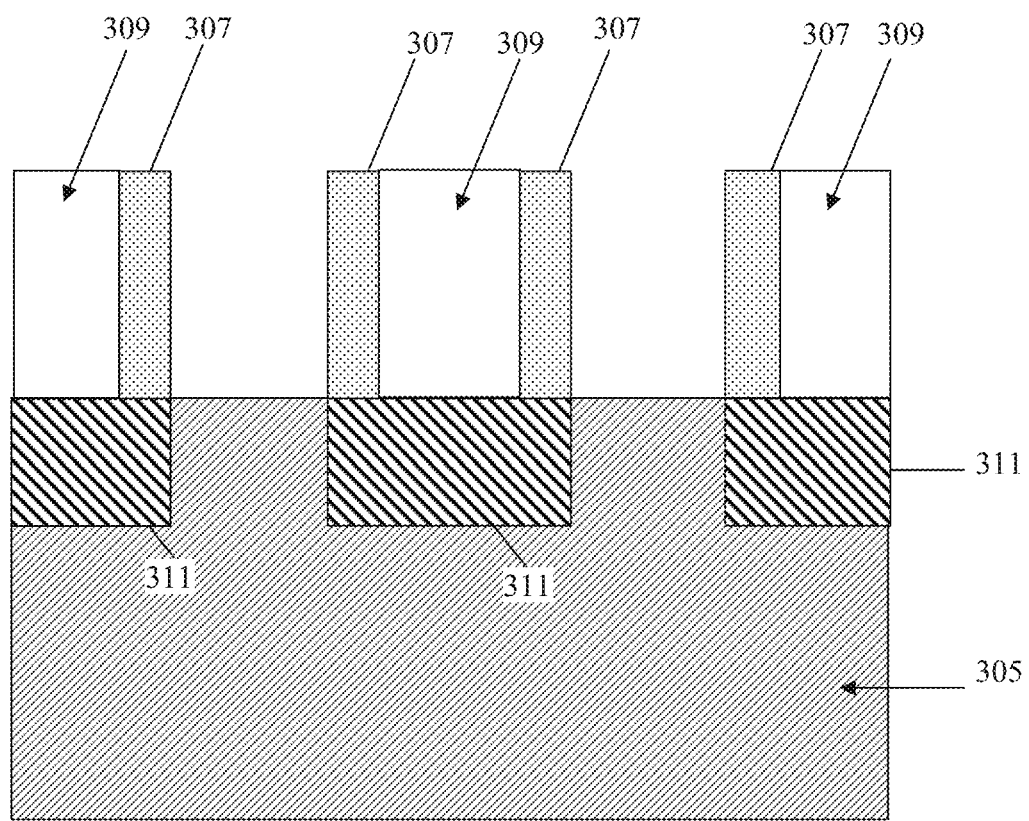

In FIG. 3B, the dummy gates 301 and 303 are removed to expose the substrate 305 between the spacers 307. The dummy gates 301 and 303 may be removed by a wet etching process using an etching solution such as ammonium hydroxide ($NH_4OH$), dilute hydrofluoric acid (HF), or other suitable wet etchants; or they may be removed by a dry etchant process using suitable etchants such as fluorine or chlorine based dry etchants. The removal of the dummy gates 301 and 303 forms two cavities in which a capacitor and an access transistor will be formed, respectively.

Figure 3C:
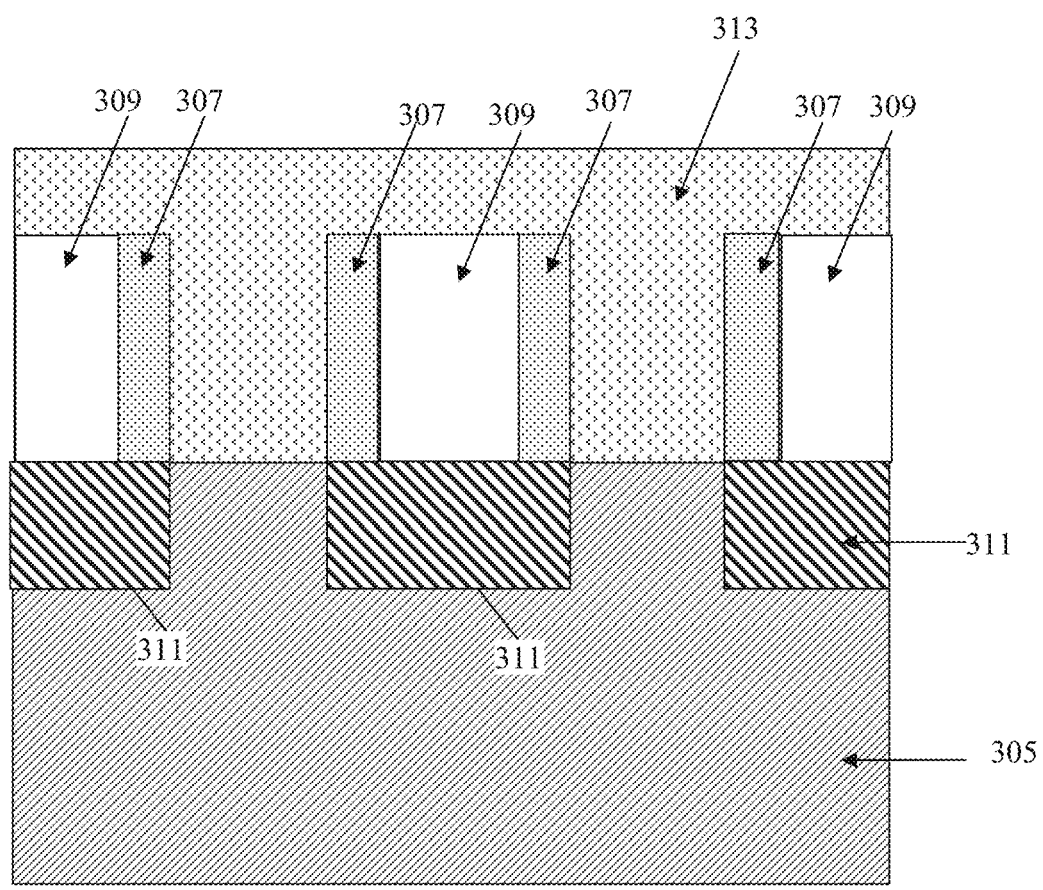

Adverting to FIG. 3C, a spun-on-hardmask 313 covers the substrate layer 305, the spacers 307, and the ILD 309. The hardmask 313 may be formed, for example, by CVD, PVD, ALD, spin-on deposition processes. Exemplary materials for the hardmask include but are not limited to polysilicon, amorphous silicon, $SiO_2$, $Si_3N_3$, spin-on glass, and combinations thereof. In addition, the hardmask material may be planarized using a CMP process to provide a smooth surface.

Figure 3D:
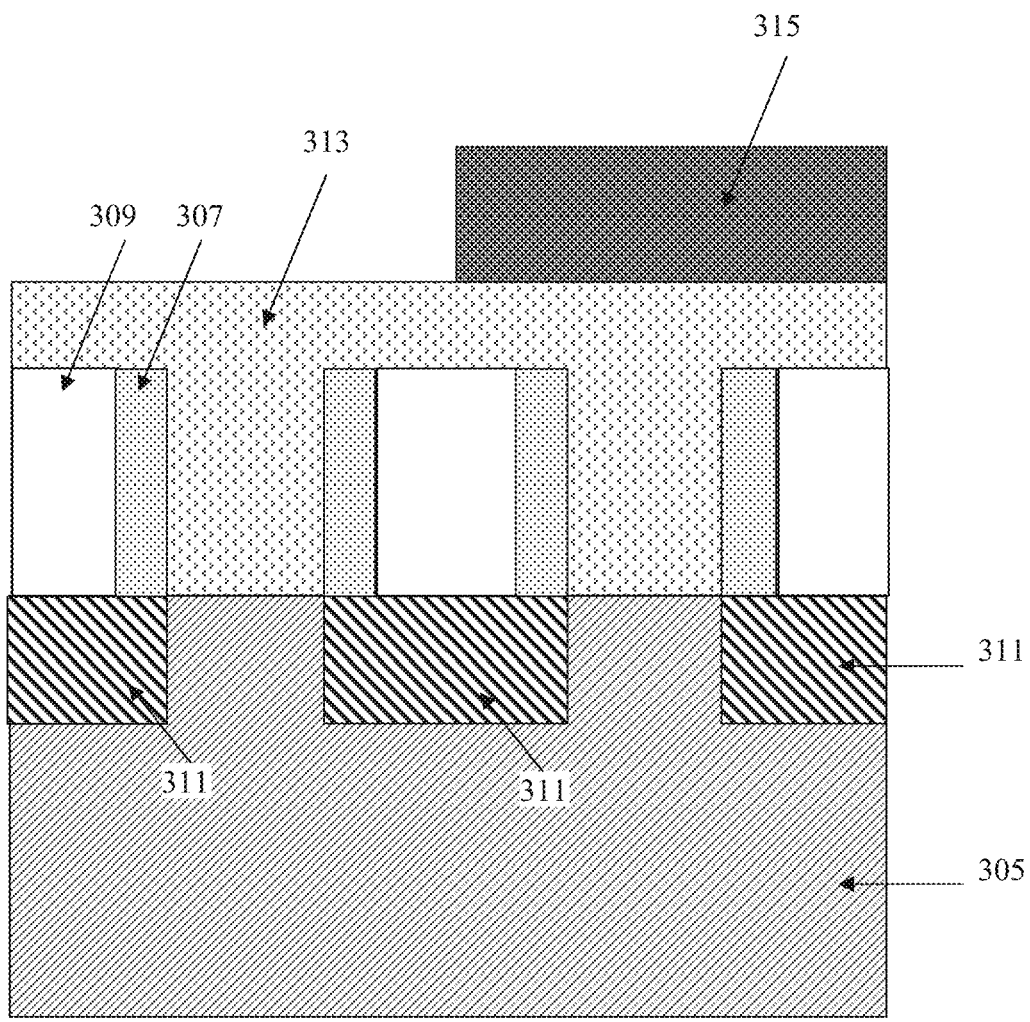

As illustrated in FIG. 3D, photoresist 315 covers a region of the hardmask 313 where a dummy gate 303 was removed. Photoresist 315 may be formed by deposition (e.g., spin-on) or other photolithographic processes known in the art.

Figure 3E:
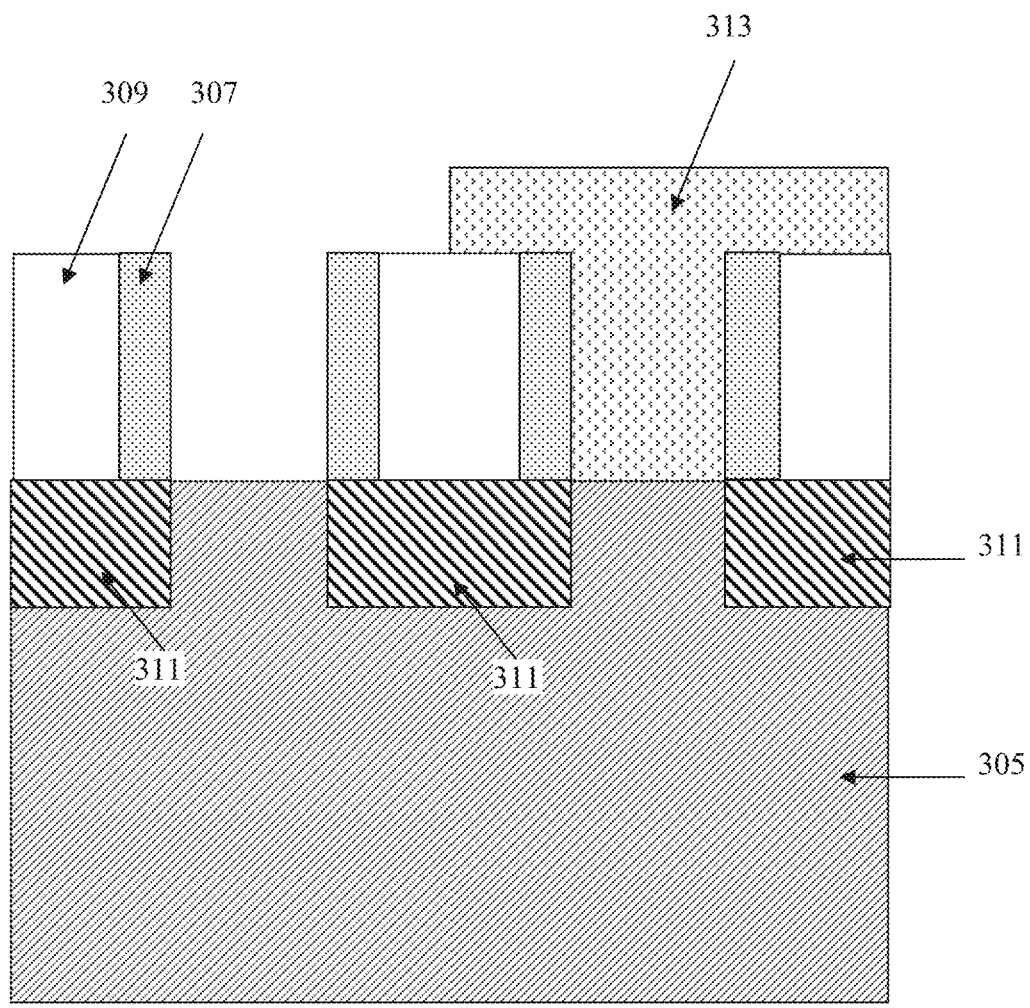

In FIG. 3E, portions of hardmask 313 exposed by photoresist 315 are removed, in turn exposing a portion of substrate 305. The hardmask may be removed by any suitable methods known in the art. These methods include, for example, removal by treatment with $NH_4OH$ and dilute HF solutions, solvents, phosphoric acid and dry etching. In addition, photoresist 315 is also removed.

Figure 3F:
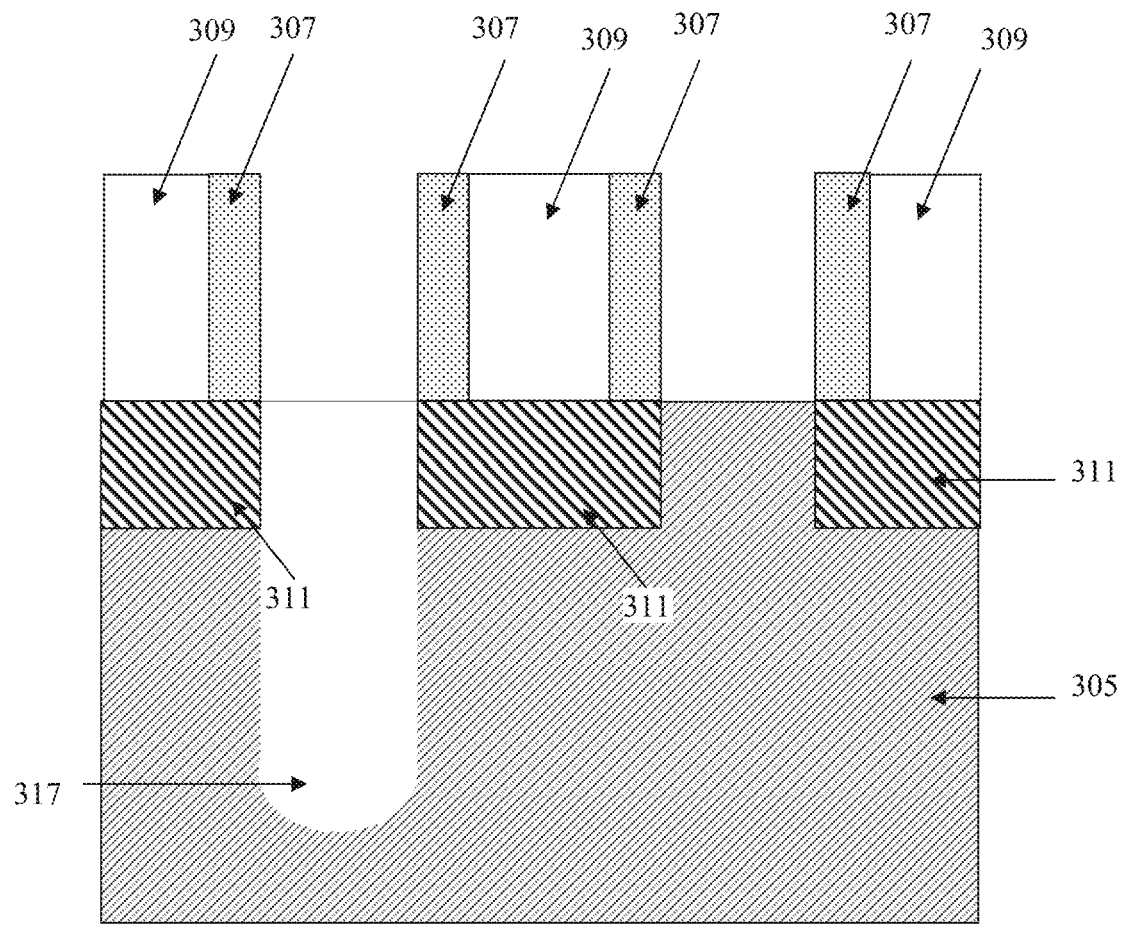

Adverting to FIG. 3F, deep trench 317 is formed in the exposed substrate 305 by RIE (i.e. Si etching if based on planar MOSFET flow, and oxide etching if based on FinFET flow). The deep trench 317 extends between spacers 307. The deep trench 317 may have an overall depth of 50 to 1000 nm, and a width of 50 to 150 nm. The deep trench 317 may be much deeper than it is wide, for example, having an aspect ratio of 40:1. After deep trench 317 is formed, ions may optionally be implanted into the trench capacitor (for forming highly doped or more conductive Si trench bottom), the remainder of hardmask 313 is removed by etching, and a cleaning process is employed to prepare the surface for upcoming depositions.

Figure 3G:
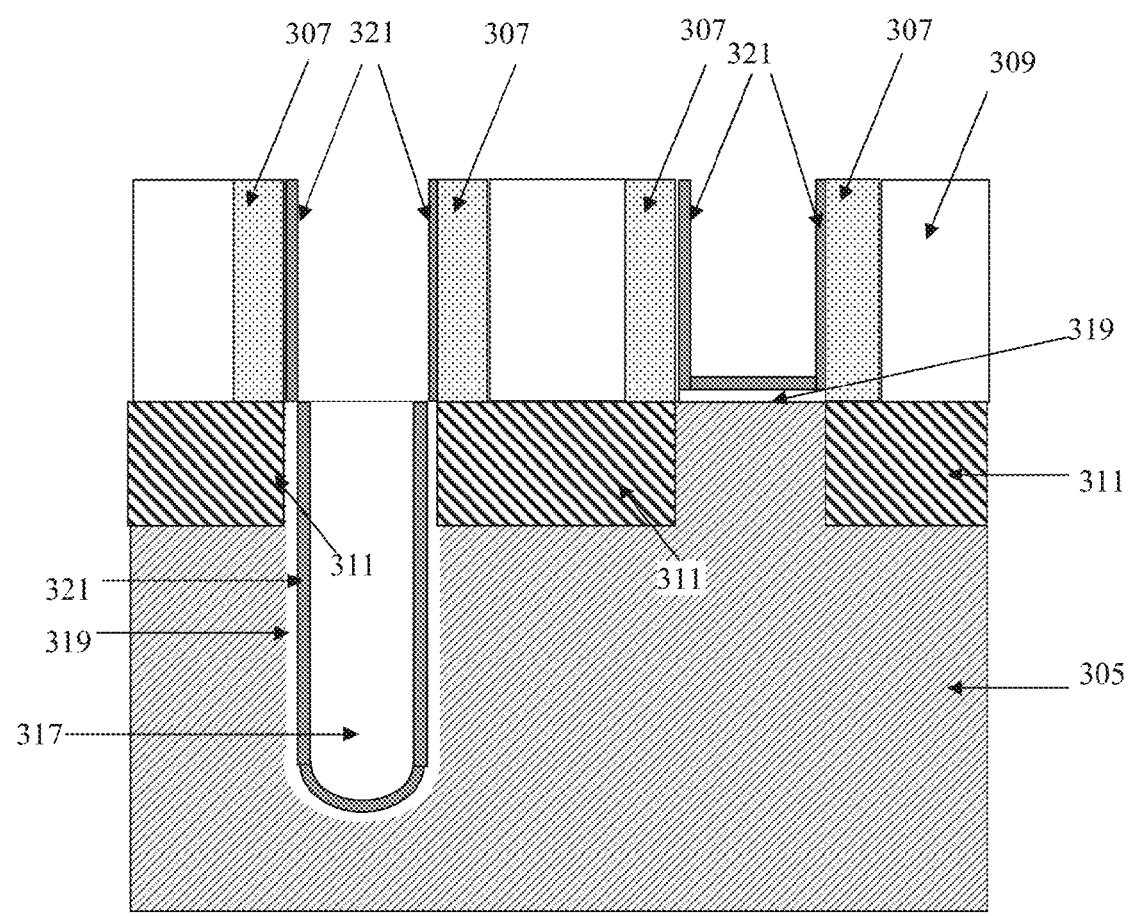

In FIG. 3G, an insulating layer 319 is formed concurrently in the deep trench 317 for the capacitor and in the bottom of the cavity formed for the access transistor. Next, a high-k dielectric 321 is conformally formed concurrently on sidewalls of both cavities, in the deep trench 317, and on the bottom surface of the cavity for the access transistor. Examples of suitable insulating layers include oxide materials, for example, $SiO_2$ and $Si_2N_2O$. The high-k dielectric material may, for example, be $HfO_2$ and may be deposited, for example, by ALD.

Figure 3H:
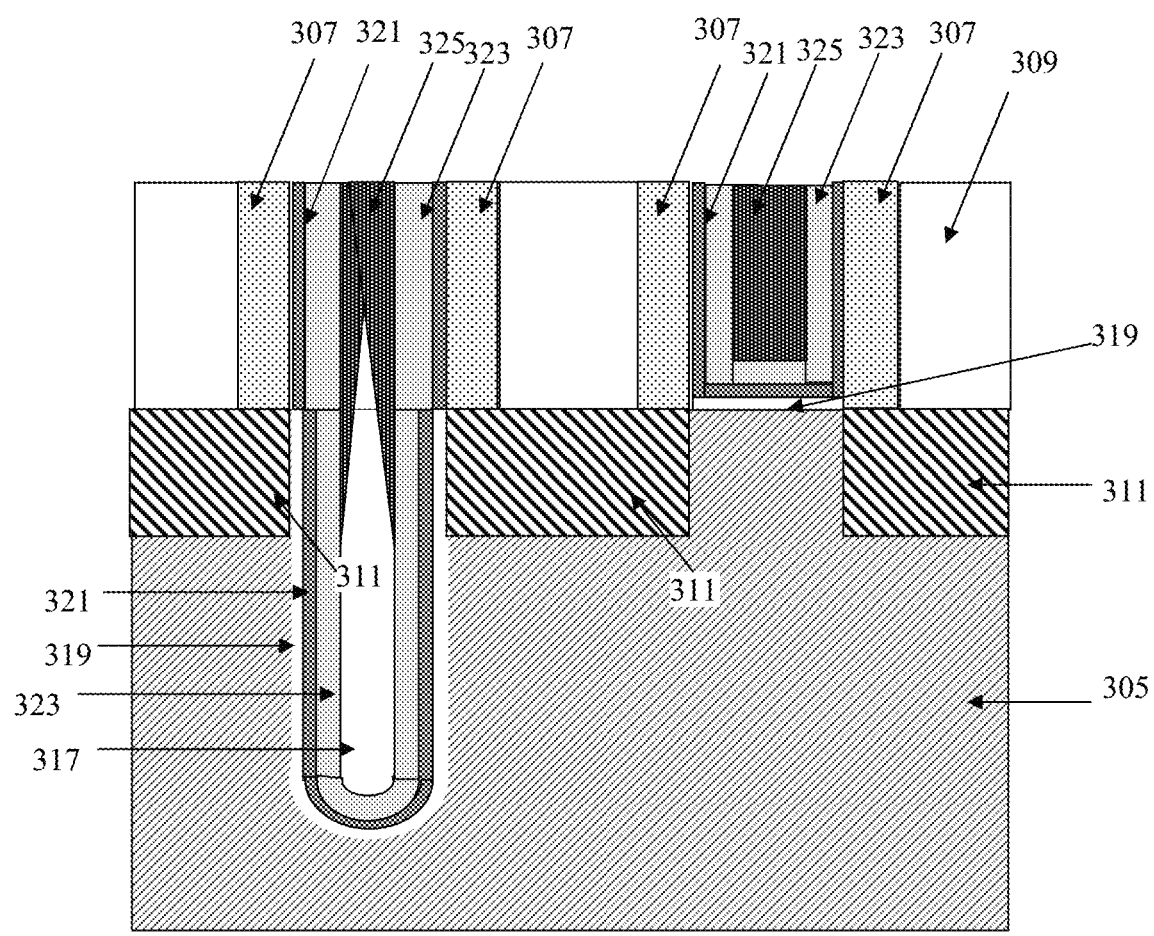

In FIG. 3H, the a first conductor 323 is formed concurrently on high-k dielectric 321 in the deep trench 317, on sidewalls of both cavities, and on the bottom surface of the cavity for the access transistor. The first conductor 323 may include a layer of TiN and/or TaN. The first conductor 323 may be deposited, for example, by ALD. A second conductor 325 is then deposited in both cavities and the deep trench. The second conductor 325 may be any metal fill used to complete the replacement metal gate process for the transistor. In filling the deep trench, the metal fill may pinch off, as shown in FIG. 3H.

Finally, as shown in FIG. 1, the addition of a strap (or interconnect) (not shown in FIG. 3H for illustrative convenience) completes the connection between the drain 311 and the second conductor 325 of the capacitor to complete the eDRAM cell.

In the case of a FinFET, such as illustrated in FIGS. 2A through 2D, the process is substantially the same as described with respect to FIGS. 3A through 3H. However, cavities are formed over the fin and adjacent STI region, rather than on the substrate, and the deep trench is formed in the STI region by an oxide etch selective to silicon, rather than in the substrate.

The embodiments of the present disclosure can achieve several technical effects, such as by providing methods for decreasing the cost and complexity of fabricating an eDRAM cell while increasing the area density and memory performance of the cell. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second dummy electrodes on a substrate, each dummy electrode having spacers at opposite sides and being surrounded by an inter-layer dielectric (ILD);
   removing the first and second dummy electrodes, forming first and second cavities, respectively;
   forming a spin-on glass hardmask over the substrate, the spacers and ILD and filling in the first and second cavities with the spin-on glass hardmask down to an upper surface of the substrate such that the spin-on glass hardmask is in direct contact with the upper surface of the substrate;
   forming a photoresist over the second cavity and exposing the first cavity;
   forming a deep trench in the substrate through the first cavity;
   removing the spin-on glass hardmask; and
   forming a capacitor in the first cavity and deep trench and concurrently forming an access transistor in the second cavity.

2. The method according to claim 1, comprising forming the capacitor and the access transistor by:
   forming a high-k dielectric layer and a first metal layer, sequentially, in the first cavity and deep trench and in the second cavity; and
   filling the first cavity and deep trench and the second cavity with a second metal.

3. The method according to claim 1, further comprising forming source/drain regions in the substrate at opposite sides of the second dummy electrode prior to removing the dummy electrodes.

4. The method according to claim 1, comprising removing the spin-on glass hardmask by etching.

5. The method according to claim 1, comprising forming the deep trench by reactive ion etching.

6. The method according to claim 2, comprising forming the high-k dielectric layer and the first metal layer by atomic layer deposition (ALD).

7. The method according to claim 3, further comprising connecting the second metal in the second cavity to a wordline, the source region to a bitline, and the second metal in the first cavity to the drain region.

8. The method according to claim 6, comprising forming the first metal layer of titanium nitride (TiN)/tantalum nitride (TaN).

9. A method comprising:
   forming first and second dummy electrodes over a silicon fin and an adjacent shallow trench isolation (STI) region formed on a substrate, each dummy electrode having spacers at opposite sides and being surrounded by an inter-layer dielectric (ILD);
   removing the first and second dummy electrodes, forming first and second cavities, respectively;
   forming a spin-on glass hardmask over the substrate, the spacers and ILD and filling in the first and second cavities with the spin-on glass hardmask down to an upper surface of the substrate such that the spin-on glass hardmask is in direct contact with the upper surface of the substrate;
   forming a photoresist over the second cavity and exposing a portion of the first cavity over the STI region;
   forming a deep trench in the STI region through the portion of the first cavity;

removing the spin-on glass hardmask; and forming a capacitor in the first cavity and deep trench and concurrently forming an access transistor in the second cavity.

10. The method according to claim 9, comprising forming the capacitor and the access transistor by:

forming a high-k dielectric layer and a first metal layer, sequentially, in the first cavity and deep trench and in the second cavity; and filling the first cavity and deep trench and the second cavity with a second metal.

11. The method according to claim 9, further comprising epitaxially growing source/drain regions on the silicon fin at opposite sides of the second dummy electrode prior to removing the dummy electrodes.

12. The method according to claim 9, comprising removing the spin-on glass hardmask by etching.

13. The method according to claim 9, comprising forming the deep trench by reactive ion etching.

14. The method according to claim 10, comprising forming the high-k dielectric layer and the first metal layer by atomic layer deposition (ALD).

15. The method according to claim 11, further comprising connecting the second metal in the second cavity to a wordline, the source region to a bitline, and the second metal in the first cavity to the drain region.

16. The method according to claim 14, comprising forming the first metal layer of titanium nitride (TiN)/tantalum nitride (TaN).

17. A method comprising:

forming first and second dummy electrodes over a substrate, forming source/drain regions at opposite sides of the second dummy electrode;

forming spacers at opposite sides of each of the first and second dummy electrodes and forming an inter-layer dielectric (ILD) over the substrate;

chemical mechanical polishing (CMP) the ILD down to a top surface of the first and second dummy electrodes;

removing the first and second dummy electrodes, forming first and second cavities, respectively;

spinning on a spin-on glass hardmask over the substrate, the spacers and ILD and filling in the first and second cavities with the spin-on glass hardmask down to an upper surface of the substrate such that the spin-on glass hardmask is in direct contact with the upper surface of the substrate;

forming a photoresist over the second cavity and exposing the first cavity;

etching a deep trench through the first cavity;

removing the spin-on glass hardmask; and forming a capacitor in the first cavity and deep trench and concurrently forming an access transistor in the second cavity by:

depositing a high-k dielectric layer and a titanium nitride (TiN)/tantalum nitride (TaN) layer, sequentially by atomic layer deposition (ALD), in the first cavity and deep trench and in the second cavity; and filling the first cavity and deep trench and the second cavity with a metal.

18. The method of claim 17, further comprising:

forming silicon fins separated by shallow trench isolation (STI) regions on the substrate;

forming the dummy electrodes over the silicon fins and STI regions; and forming the deep trench in an STI region.

\* \* \* \* \*